United States Patent
Thalmann

(10) Patent No.: US 7,228,477 B2
(45) Date of Patent: Jun. 5, 2007

(54) APPARATUS AND METHOD FOR TESTING CIRCUIT UNITS TO BE TESTED

(75) Inventor: Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 289 days.

(21) Appl. No.: 10/917,176

(22) Filed: Aug. 12, 2004

(65) Prior Publication Data

US 2005/0044462 A1    Feb. 24, 2005

(30) Foreign Application Priority Data

Aug. 22, 2003  (DE) ................ 103 38 678

(51) Int. Cl.
  *G01R 31/3193*  (2006.01)
  *G01R 31/333*  (2006.01)
(52) U.S. Cl. ........................... 714/735; 714/719
(58) Field of Classification Search ............. 714/735, 714/719, 731, 720, 736, 738, 718, 732, 733, 714/25, 42, 54, 702, 763; 365/201, 200
  See application file for complete search history.

(56) References Cited

U.S. PATENT DOCUMENTS

| 5,185,744 A | * | 2/1993 | Arimoto et al. ............. 714/719 |
| 5,457,696 A | * | 10/1995 | Mori ............................ 714/720 |
| 6,357,027 B1 | | 3/2002 | Frankowsky |
| 6,650,583 B2 | * | 11/2003 | Haraguchi et al. ........... 365/201 |
| 6,651,200 B1 | * | 11/2003 | Barahmand et al. ......... 714/731 |
| 2003/0005389 A1 | | 1/2003 | Ernst et al. |

FOREIGN PATENT DOCUMENTS

DE    101 22 619 C1    2/2003
EP      1061526 A1    12/2000

* cited by examiner

*Primary Examiner*—Albert Decady
*Assistant Examiner*—Dipakkumar Gandhi
(74) *Attorney, Agent, or Firm*—Jenkins, Wilson, Taylor & Hunt, P.A.

(57) ABSTRACT

Apparatus and Method for Testing Circuit Units To Be Tested. According to one aspect, a test apparatus for testing circuit units to be tested, includes a nominal data production unit for production of a nominal data stream, a comparison device for comparison of an actual data stream which is emitted from the circuit unit to be tested as a function of the nominal data stream that is supplied with the nominal data stream; and a compression device for compression of an intermediate result signal which is emitted from the comparison device as a function of the comparison into a test result signal, with the intermediate result signal (108) which is emitted from the comparison device being temporarily stored in a buffer storage device with the intermediate result signal which is temporarily stored in a buffer storage device being read by means of a read unit.

15 Claims, 1 Drawing Sheet

APPARATUS AND METHOD FOR TESTING CIRCUIT UNITS TO BE TESTED

TECHNICAL FIELD

The present invention relates in general to test apparatuses for testing circuit units to be tested, and relates in particular to a test apparatus having a nominal data production unit for production of a nominal data stream which can be supplied to the circuit unit to be tested, having a comparison device for comparison of an actual data stream (which is emitted from the circuit unit to be tested as a function of the nominal data stream which is supplied) with the nominal data stream, and having a compression device for compression of an intermediate result signal (which is emitted from the comparison device as a function of the comparison) into a test result signal.

BACKGROUND ART

A test apparatus such as this is illustrated by way of example in FIG. 2, and is used, for example, in order to test main memories of electronic circuit units (chips) with specific test modes (TM). The ACTM test mode (advanced compression test mode) is known, for example, as one such test mode. The advantages of a test mode such as this, are, on the one hand, that the circuit unit to be tested is tested internally by means of 16 I/O connecting pins, thus saving test time, and on the other hand that a test comparison is carried out internally, that is to say read and expected data or actual data streams and nominal data streams are compared internally.

Furthermore, data compression is advantageously carried out in a compression device to form 1 bit. This compressed test information is then emitted via a single I/O connecting pin.

This makes it possible to use conventional test apparatuses to determine whether a circuit unit to be tested has a fault, or whether it is operating without any faults. If only a single fault occurs during the course of a test on the circuit unit to be tested, then a test result signal which is compressed to 1 bit is set such that it indicates faulty operation of the circuit unit to be tested.

However, one disadvantageous feature is that it is not possible to determine a location at which and/or the time during the test at which a fault was found in the circuit unit to be tested.

Furthermore, in the case of so-called DDR memory modules (DDR=double data rate), each data access always results in even-numbered data and odd-numbered data, which is respectively read and written on the rising and falling clock flanks. If the circuit unit to be tested is operated internally with a length of 16 bits, then 32 bits are in each case produced on reading and writing, that is to say 16 bits of odd-numbered data and 16 bits of even-numbered data, which are then subsequently compressed in the compression device to form 1 bit of the test result signal. This compressed test information is conventionally emitted via an I/O connecting pin of the test apparatus.

One major disadvantage of conventional test apparatuses is therefore that they do not produce exact fault association. If, for example 32-bit data streams are compressed to form a test result signal comprising 1 bit, then, disadvantageously, it is no longer possible to locate an exact fault address. This disadvantageously means that correct physical fault analysis is no longer possible, even though this is required when the circuit unit to be tested is being analyzed or broken down.

During the production of circuit units, all that is important is to know whether the circuit unit has no faults (that is to say "pass") or has faults (that is to say "fail"). The exact fault addresses are, however, critical for localization of the circuit unit to be tested for fault analysis purposes.

In order to solve this problem, it has been proposed that the corresponding ACTM test, which involves 32:1 compression, be rewritten to form a test without ACTM, in order that the circuit unit to be tested is tested without any compression. However, this results in the disadvantage that it involves additional complexity for writing a new test, that is to say additional programming effort.

A further disadvantage is that a new fault source can occur during conversion of a test to a non-ACTM test. An additional disadvantage is that a test such as this requires a test set that is not the same as that for an ACTM test, so that data is read and written via all of the I/O connecting pins. A final disadvantage of a test such as this is that the test time is increased, and that the tests are tested in their basic organization (×4, ×8, or ×16).

SUMMARY OF THE INVENTION

One object of the present invention is therefore to provide a test apparatus and a method which allow localization of the exact fault address in addition to production of a compressed test result signal.

According to the invention, this object is achieved by a test apparatus having the features of Patent claim 1.

A further object is achieved by a method as specified in Patent claim 9.

Further refinements of the invention will become evident from the dependent claims.

One major idea of the invention is that the results which are obtained by a comparison between a nominal data stream and actual data streams can be stored in a buffer storage device, and can then be read successively via an address bus, by means of which the circuit unit to be tested is addressed.

The advantage of the present invention is thus that any fault which occurs can be localized, in addition to the production of a test result signal.

The test apparatus according to the prior art, as illustrated in FIG. 2, disadvantageously produces only a compressed 1-bit test result signal.

In the conventional test apparatus, as shown in FIG. 2, for testing circuit units to be tested, which are not shown in FIG. 2, even-numbered actual data streams and odd-numbered actual data streams, which each have a length of 16 bits, are obtained from the circuit unit to be tested after application of nominal data. A comparison unit is also supplied with nominal data streams, which have a length of 32 bits.

The comparison unit emits the intermediate result data stream which has a length of 32 bits and is then compressed in a compression unit in order to produce a test result signal with a length of 1 bit. In the conventional method for testing of circuit units to be tested, all that is possible is to determine whether a fault has occurred in the circuit unit to be tested during a test, but it is not possible to localize the fault.

The method according to the invention advantageously uses the intermediate result data stream which is emitted from the comparison unit, and stores intermediate results in a buffer storage device. Finally, these intermediate results can advantageously be emitted via an address bus (not shown), by means of which the circuit unit to be tested (not shown) is driven.

It is thus expedient that the test apparatus and the method according to the present invention allow an exact fault address to be localized, and that it is possible to use the existing production equipment. At the same time, one advantage is that a link can be provided between the test apparatus and the circuit unit (HIFIX) to be tested. The conventional test method which is carried out in the test apparatus is advantageously not adversely affected by the test apparatus according to the invention.

The test apparatus according to the invention for testing a circuit unit to be tested thus essentially has:

a) a nominal data production unit for production of a nominal data stream, which can be supplied to the circuit unit to be tested;

b) a comparison device for comparison of an actual data stream (which is emitted from the circuit unit to be tested as a function of the nominal data stream that is supplied) with the nominal data stream;

c) a compression device for compression of an intermediate result signal (which is emitted from a comparison device as a function of the comparison between the actual data stream and the nominal data stream) into a test result signal;

d) a buffer storage device for temporary storage of the intermediate result signal which is emitted from the comparison device; and e) a read unit for reading the intermediate result signal which is temporarily stored in the buffer storage device wherein the read unit is designed so as to subdivide the intermediate result signal which is temporarily stored in the buffer storage device, into separate result blocks.

Furthermore, the method according to the invention for testing a circuit unit to be tested in a test apparatus essentially has the following steps:

a) production of a nominal data stream by means of a nominal data production unit;

b) supply of the nominal data stream to the circuit unit to be tested;

c) comparison of an actual data stream (which is emitted from the circuit unit to be tested as a function of the nominal data stream which is supplied) with the nominal data stream by means of a comparison device;

d) compression of an intermediate result signal (which is emitted from the comparison device as a function of the comparison) into a test result signal, by means of a compression device;

e) temporarily storing the intermediate result signal which is emitted from the comparison device in a buffer storage device; and f) reading the intermediate result signal which is temporarily stored in the buffer storage device by means of a read unit; wherein f1) the read unit (111) subdivides the intermediate result signal (108), which is temporarily stored in the buffer storage device (109), into separate result blocks (118), and wherein f2) the result blocks (118) which are emitted from the read unit (111) are read via an address bus (114) of the circuit unit (117) to be tested.

Advantageous developments and improvements of the respective subject matter of the invention can be found in the dependent claims.

According to one preferred development of the present invention, the compression device is designed for compression of an intermediate result signal which is emitted from the comparison device, such that the test result comprises 1 bit of information.

It is thus advantageously possible to determine whether a circuit unit to be tested is fault-free or is faulty. If the circuit unit to be tested is found from the test to be fault-free, the intermediate result signals which have been temporarily stored in the buffer storage device are not required for localization of any fault in the circuit unit to be tested but are expediently not processed any further.

According to a further preferred development of the present invention, the compression device has at least one logic circuit which is in the form of an AND function, such that the test result signal indicates fault-free operation of the circuit unit to be tested only when each of the intermediate result signals indicates fault-free operation of the circuit unit to be tested.

According to yet another preferred development of the present invention, the test result signal has a length of one bit.

According to yet another preferred development of the present invention, the actual data stream comprises odd-numbered actual data and even-numbered actual data. Such odd-numbered actual data and even-numbered actual data in the actual data stream is preferably in each case obtained at double the data rate (DDR=double data rate) for circuit units to be tested. The nominal data stream and/or the actual data stream, preferably have/has a length of 32 bits.

It is also advantageous for the intermediate result signal which is temporarily stored in the buffer storage device and which is obtained by the comparison (which is carried out in the comparison device) between the actual data stream and the nominal data stream, to have a length of 32 bits.

The result blocks which are produced by the read unit and are produced by subdivision of the intermediate result signal which is temporarily stored in the buffer storage device, preferably have a length of 8 bits. This preferably means that the intermediate result signal, which has a length of 32 bits, can be read in four blocks of 8 bits each. The result blocks which are emitted from the read unit are expediently read via an address bus of the circuit unit to be tested. This results in the advantage that conventional connecting units for the circuit unit to be tested can be used for the test apparatus.

The result blocks which are emitted from the read unit are preferably read via the address bus of the circuit unit to be tested, as a function of a test mode signal which is supplied to the read unit. This test mode signal determines a test mode of the circuit unit to be tested, and is supplied to the read unit 111 from the circuit unit to be tested.

Exemplary embodiments of the invention will be explained in more detail in the following description, and are illustrated in the drawings, in which:

DETAILED DESCRIPTION OF THE INVENTION

Identical reference symbols denote identical or functionally identical components or steps in the figures.

Figure 1:
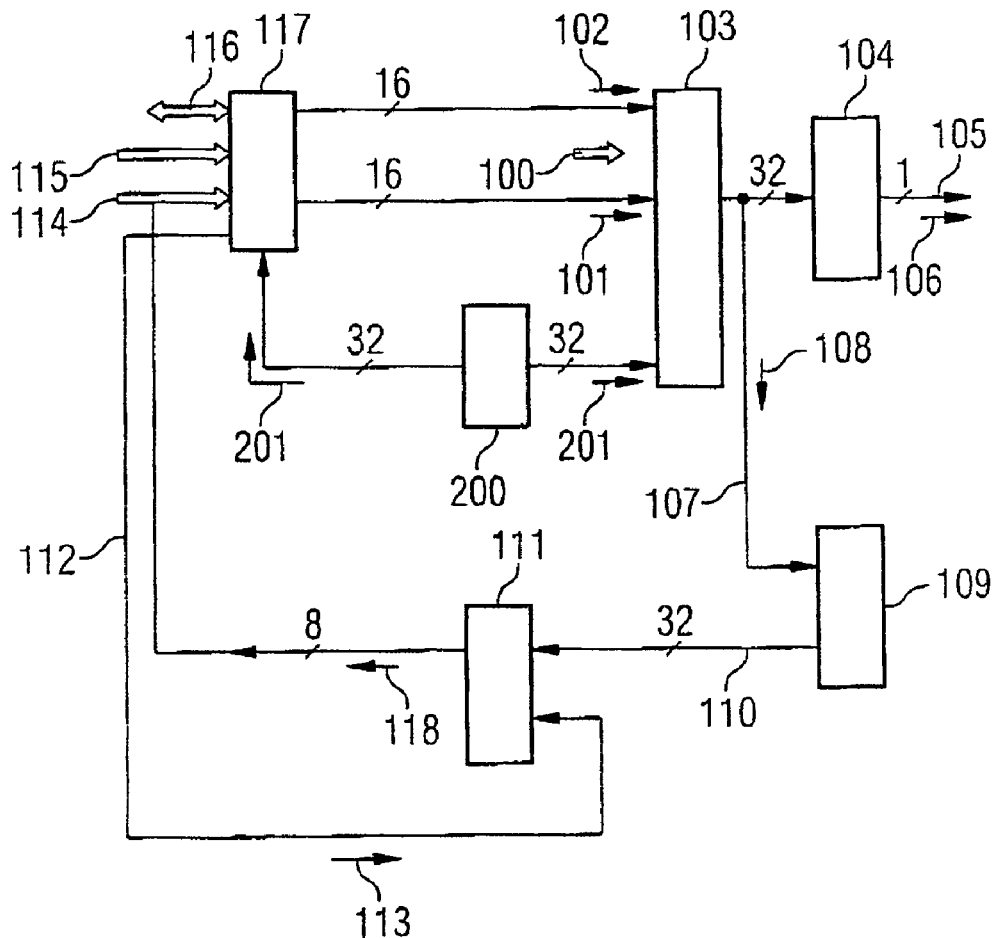
FIG. 1 shows a block diagram of a test apparatus for testing circuit units to be tested, with a test result signal and an intermediate result signal being emitted, according to one preferred exemplary embodiment of the present invention.

In the block diagram of one preferred exemplary embodiment of a test apparatus according to the present invention as shown in FIG. 1, a reference symbol 117 denotes a circuit unit to be tested. The circuit unit to be tested is connected via a data bus 116 to a test environment, with data being interchanged with the test environment via the data bus 116. Furthermore, a control data stream is supplied via a control bus 115 to the circuit unit 117 to be tested. An addressing data stream, which is supplied via an addressing bus 114, is used for addressing the data which is stored in the circuit unit 117 to be tested.

A reference symbol 200 denotes a nominal data production unit. A nominal data stream 201 which is emitted from the nominal data production unit 200 is supplied on the one hand to the circuit unit 117 to be tested, and on the other hand to a comparison device 103. In the preferred exemplary embodiment of the present invention, the nominal data stream has a length of 32 bits. The circuit unit 117 to be tested is tested by means of the nominal data stream 201, as a function of a test mode which is predetermined by the test apparatus.

An actual data stream 100 is obtained from the circuit unit 117 to be tested, as a function of the nominal data stream 201 which is supplied to the circuit unit 117 to be tested. In the preferred exemplary embodiment of the present invention, the circuit unit 117 to be tested comprises memory modules using double the data rate (DDR). In the case of a DDR method, two data items, that is to say odd-numbered data and even-numbered data, are read on each data access. Those skilled in the art will be aware that the even-numbered data is read (or written) on a rising clock flank of a clock signal which is supplied and the odd-numbered data is read (or written) on a falling clock flank of the clock signal which is supplied.

As is shown in FIG. 1, the actual data stream 100 which is emitted from the circuit unit 117 to be tested thus comprises even-numbered actual data 102 and odd-numbered actual data 101. If the nominal data stream 201 has a length of 32 bits, this results in both the even-numbered actual data 102 and the odd-numbered actual data 101 each having a length of 16 bits. The nominal data stream 201 and the actual data stream 100, which comprises even-numbered actual data 102 and odd-numbered actual data 101, are compared with one another in the comparison device 103. The comparison of the nominal data stream 201 with the actual data stream 100 by the comparison device 103 results in an intermediate result signal 108 which, according to the preferred exemplary embodiment of the present invention, has a length of 32 bits. According to the invention, this intermediate result signal 108 is now used for localization of any fault which may possibly be present in the circuit unit 117 to be tested.

As in the case of conventional test methods, the intermediate result signal 108 is supplied to a compression device 104 while the intermediate result signal 108 is compressed such that a test result signal 106 which has been compressed can be emitted on a test output line 105 from the compression device 104 and, as is shown in the exemplary embodiment illustrated in FIG. 1, has a length of 1 bit.

The compression device preferably comprises at least one logic circuit in the form of an AND function, with the test result signal 106 indicating fault-free operation of the circuit unit 117 to be tested only when each of the intermediate result signals 108 indicates fault-free operation of the circuit unit 117 to be tested. The logic circuit, which is in the form of an AND function, comprises, for example, AND gate units which link the results of the individual tests which are carried out in the comparison device 103, such that, if one or more of the tests indicates faulty operation of the circuit unit 117 to be tested, the test result signal 106 which is emitted via the test output line 105 then indicates faulty operation of the entire circuit unit to be tested.

While the test result signal 106 which is obtained is thus sufficient in principle to distinguish between a fault-free circuit unit and a faulty circuit unit, the test result signal 106 cannot be used for physical fault analysis, that is to say it is not possible to use the test result signal 106 to carry out fault localization, since the information about the location and/or the time of the fault that has occurred is lost by the compression process that is carried out in the compression device 104.

According to the invention, the intermediate result signal 108 is now supplied via an intermediate result output line 107 to a buffer storage device 109. This buffer storage device 109, which is incorporated in the test apparatus, now stores the entire intermediate result data stream with the length of 32 bits, and provides it for reading on an output line 110. The intermediate result signal 108 may thus, for example, be read-as a function of a test mode signal 113, which is obtained by the circuit unit 117 to be tested and is supplied to a read unit 111 via a test mode line 112. The buffer storage device 109 and the read unit 111 are connected to one another via the output line 110.

According to the preferred exemplary embodiment of the invention, the output line has a length of 32 bits. The output of the read unit 111 is connected to the address bus 114. It is thus possible for the intermediate result signal 108 which is emitted from the buffer storage device 109 to be subdivided into blocks, which can be supplied to the address bus 114 in order to successively read the intermediate result via the address bus 114.

In the preferred exemplary embodiment of the present invention, as is illustrated in FIG. 1, result blocks 118 are provided, which each have a length of 8 bits. An intermediate result signal which is stored in the intermediate result storage device 109 is thus read in four blocks, which each have a length of 8 bits.

As is evident from the block diagram illustrated in FIG. 1, the test apparatus according to the invention has, in particular, the advantage that no additional connecting units need be provided for reading additional information which is contained in the intermediate result signal 108. As in the case of the conventional test method, information is provided as a test result signal 106 on the test output line 105 as to whether the circuit unit 117 currently being tested is fault-free or faulty. Furthermore, the test method according to the invention for testing circuit units 117 to be tested also, however, provides complete information in the form of the intermediate result signal 108 about each individual comparison (which is carried out in the comparison device 103) between the nominal data stream 201 and the actual data stream 100.

The test method according to the invention thus stores intermediate results before they are compressed and are emitted via the test output line 105. It is also possible for this intermediate result to be read only when required via a test mode, that is to say only when the test result signal 106 indicates a fault in the circuit unit 117 to be tested. Fault-free operation of the circuit unit 117 to be tested is indicated by the test result signal 106, which is emitted on the test output line 105, only when all 32 comparison values which are obtained in the comparison device 103 match, that is to say when the actual data stream 100 is the same as the nominal data stream 201.

The test method according to the invention thus advantageously makes it possible to temporarily store the 32 comparison values obtained in the comparison device 103. These comparison values can then be read by means of a test mode via the address bus 114. By way of example, in the case of a chip or in the case of a circuit unit to be tested, 13 address lines are available with a memory depth of 256 Mbits. The read unit 111 thus provides a method in which 32 comparison values are read successively, that is to say in a number of steps, as a function of a test mode 32.

The test method according to the invention for testing circuit units 117 to be tested in the test apparatus is thus carried out in the following steps:

(i) a test procedure is started in which the nominal data stream 201 is produced by means of the nominal data production unit 200, the nominal data stream 201 is supplied to the circuit unit 117 to be tested, the nominal data stream is compared with the actual data stream 100 (which is emitted from the circuit unit 117 to be tested as a function of the nominal data stream 201 which is supplied) in the comparison device 103, and the intermediate result signal 108 (which is emitted from the comparison device 103 as a function of the comparison) is compressed into the test result signal 106 by means of the compression device 104;

(ii) the compressed information about fault-free/faulty circuit units 117 is read via the test output line 105 with only the test result signal 106, which has a length of 1 bit, being evaluated;

(iii) if the evaluation of the test result signal 106 indicates that the circuit unit 117 to be tested is fault-free, no further steps are carried out; and (iv) if the evaluated test result signal 106 indicates that the circuit unit 117 to be tested is faulty, the comparison data is read by means of the test mode by temporarily storing the intermediate result signal 108, which is emitted from the comparison device 103, in the buffer storage device 109, and by using the read unit 111 to read the intermediate result signal 108, which is temporarily stored in the buffer storage device 109, and passing this on to the address bus 116.

Figure 2:
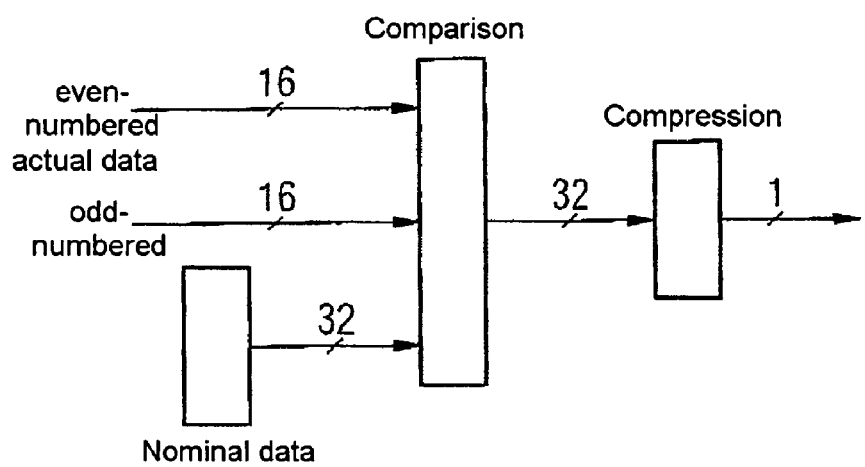
FIG. 2 shows a conventional test apparatus.

With regard to the conventional test apparatus, which is illustrated in FIG. 2, for testing of a circuit unit to be tested, reference should be made to the description introduction.

Although the present invention has been described above, with reference to preferred exemplary embodiments, it is not restricted to these but can be modified in many ways.

Furthermore, the invention is not restricted to the application options mentioned.

What is claimed is:

1. Test apparatus for testing a circuit unit to be tested, the test apparatus comprising:
    a) a nominal data production unit for production of a nominal data stream, which can be supplied to the circuit unit to be tested;
    b) a comparison device for comparison of an actual data stream which is emitted from the circuit unit to be tested as a function of the nominal data stream that is supplied with the nominal data stream;
    c) a compression device for compression of an intermediate result signal which is emitted from a comparison device as a function of the comparison into a test result signal, wherein the compression device has at least one logic circuit which is in the form of an AND function, such that the test result signal indicates fault-free operation of the circuit unit to be tested only when each of the intermediate result signals indicates fault-free operation of the circuit unit to be tested; and
    d) a buffer storage device for temporary storage of the intermediate result signal which is emitted from the comparison device, only if the test result signal indicates that the circuit unit to be tested is faulty; and
    e) wherein, the test apparatus further comprises a read unit for reading the intermediate result signal which is temporarily stored in the buffer storage device, wherein the read unit is designed so as to subdivide the intermediate result signal which is temporarily stored in the buffer storage device into separate result blocks.

2. Apparatus according to claim 1, wherein the compression device for compression of the intermediate result signal which is emitted from the comparison device is designed such that the test result signal comprises 1 bit of information.

3. Apparatus according to claim 1, wherein the test result signal has a length of 1 bit.

4. Apparatus according to claim 1, wherein the actual data stream comprises odd-numbered actual data and even-numbered actual data.

5. Apparatus according to claim 1, wherein the nominal data stream and/or the actual data stream have/has a length of 32 bits.

6. Apparatus according to claim 1, wherein the intermediate result signal which is temporarily stored in the buffer storage device has a length of 32 bits.

7. Apparatus according to claim 1, wherein the result blocks which are produced by the read unit and are produced by subdivision of the intermediate result signal which is temporarily stored in the buffer storage device have a length of 8 bits.

8. Method for testing a circuit unit to be tested, in a test apparatus, the method comprising:
    a) producing of a nominal data stream by means of a nominal data production unit;
    b) supplying of the nominal data stream to the circuit unit to be tested;
    c) comparing of an actual data stream which is emitted from the circuit unit to be tested as a function of the nominal data stream which is supplied with the nominal data stream by means of a comparison device;
    d) compressing of an intermediate result signal which is emitted from the comparison device as a function of the comparison into a test result signal, by means of a compression device, wherein the compression device carries out a logic AND operation such that the test result signal indicates fault-free operation of the circuit unit to be tested only when each of the intermediate result signals indicates fault-free operation of the circuit unit to be tested; and
    e) temporary storing of the intermediate result signal which is emitted from the comparison device in a buffer storage device, only if the test result signal indicates that the circuit unit to be tested is faulty; and
    f) reading of the intermediate result signal which is temporarily stored in the buffer storage device by means of a read unit, wherein
        f1) the read unit subdivides the intermediate result signal, which is temporarily stored in the buffer storage device, into separate result blocks, and wherein
        f2) the result blocks which are emitted from the read unit are read via an address bus of the circuit unit to be tested.

9. Method according to claim 8, wherein the intermediate result signal which is emitted from the comparison device is compressed in the compression device into 1 bit of information.

10. Method according to claim 8, wherein the test result which corresponds to a test in the circuit unit to be tested is emitted as a test result signal with a length of 1 bit via an output line from the compression device.

11. Method according to claim 8, wherein the actual data stream is formed from odd-numbered actual data and even-numbered actual data, and is emitted from the circuit unit to be tested.

12. Method according to claim 8, wherein the nominal data stream and/or the actual data stream are/is in the form of data streams with a length of 32 bits.

13. Method according to claim 8, wherein the intermediate result signal which is temporarily stored in the buffer storage device is produced as a signal with a length of 32 bits.

14. Method according to claim 8, wherein the result blocks which are produced by the read unit and are produced by subdivision of the intermediate result signal which is temporarily stored in the buffer storage device are in the form of blocks with a length of 8 bits.

15. Method according to claim 8, wherein the result blocks which are emitted from the read unit are read via the address bus of the circuit unit to be tested, as a function of a test mode signal which is supplied to the read unit.

* * * * *